United States Patent [19]

Peplow et al.

[11] 4,034,284

[45] July 5, 1977

[54] HAND-HELD WALL RECEPTACLE WIRING TESTER WITH OPPOSITELY DISPOSED PUSH/PULL SURFACES FOR INSERTION AND REMOVAL OF THE TESTER

[75] Inventors: Marvin J. Peplow; Peter M. Wells, Jr., both of Sycamore, Ill.

[73] Assignee: Ideal Industries, Inc., Sycamore, Ill.

[22] Filed: Aug. 8, 1975

[21] Appl. No.: 603,036

[52] U.S. Cl. .............................. 324/51; 339/110 P; 339/196 R
[51] Int. Cl.² ................ G01R 31/02; H01R 13/62; H01R 33/06
[58] Field of Search .................. 324/51, 66, 133; 340/255; 339/14 P, 195 R, 195 A, 195 L, 195 M, 196 R, 196 A, 196 M, 108 L, 108 TP, 110 C, 110 L, 110 P, 45 R, 45 M

[56] References Cited

UNITED STATES PATENTS

| | | | |
|---|---|---|---|
| 2,668,885 | 2/1954 | Gerlat | 339/196 A X |
| 2,675,531 | 4/1954 | Sams et al. | 339/195 R |
| 2,848,681 | 8/1958 | McKeige et al. | 324/51 |
| 3,204,212 | 8/1965 | Broder | 339/196 M X |
| 3,315,211 | 4/1967 | Weeks | 339/196 R X |
| 3,317,825 | 5/1967 | Huff | 324/51 |
| 3,383,588 | 5/1968 | Stoll et al. | 324/51 |
| 3,559,200 | 1/1971 | Walters | 340/255 |
| 3,836,844 | 9/1974 | Prugh | 324/51 |
| 3,904,958 | 9/1975 | Gartland et al. | 324/51 |
| 3,967,195 | 6/1976 | Averitt et al. | 324/51 |

*Primary Examiner*—Gerard R. Strecker
*Attorney, Agent, or Firm*—Kinzer, Plyer, Dorn & McEachran

[57] ABSTRACT

A hand-held electrical tester for checking the wiring of a wall receptacle. The blades of an electrical terminal protrude from one end of a housing which contains indicator lamps and electrical connecting means between the lamps and blades. Thus, the lighting of each lamp or combination of lamps indicates a predetermined wiring condition of a wall receptacle in which the terminal blades may be inserted. The housing is shaped to provide oppositely disposed push/pull surfaces to facilitate insertion and removal of the tester into and from a wall receptacle.

6 Claims, 6 Drawing Figures

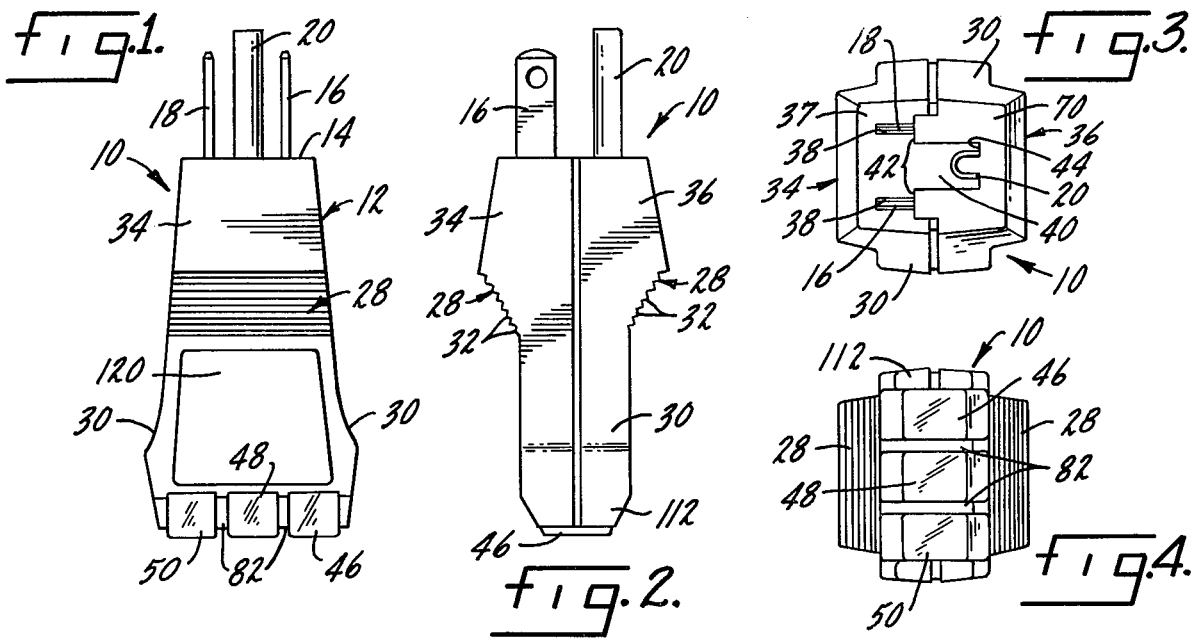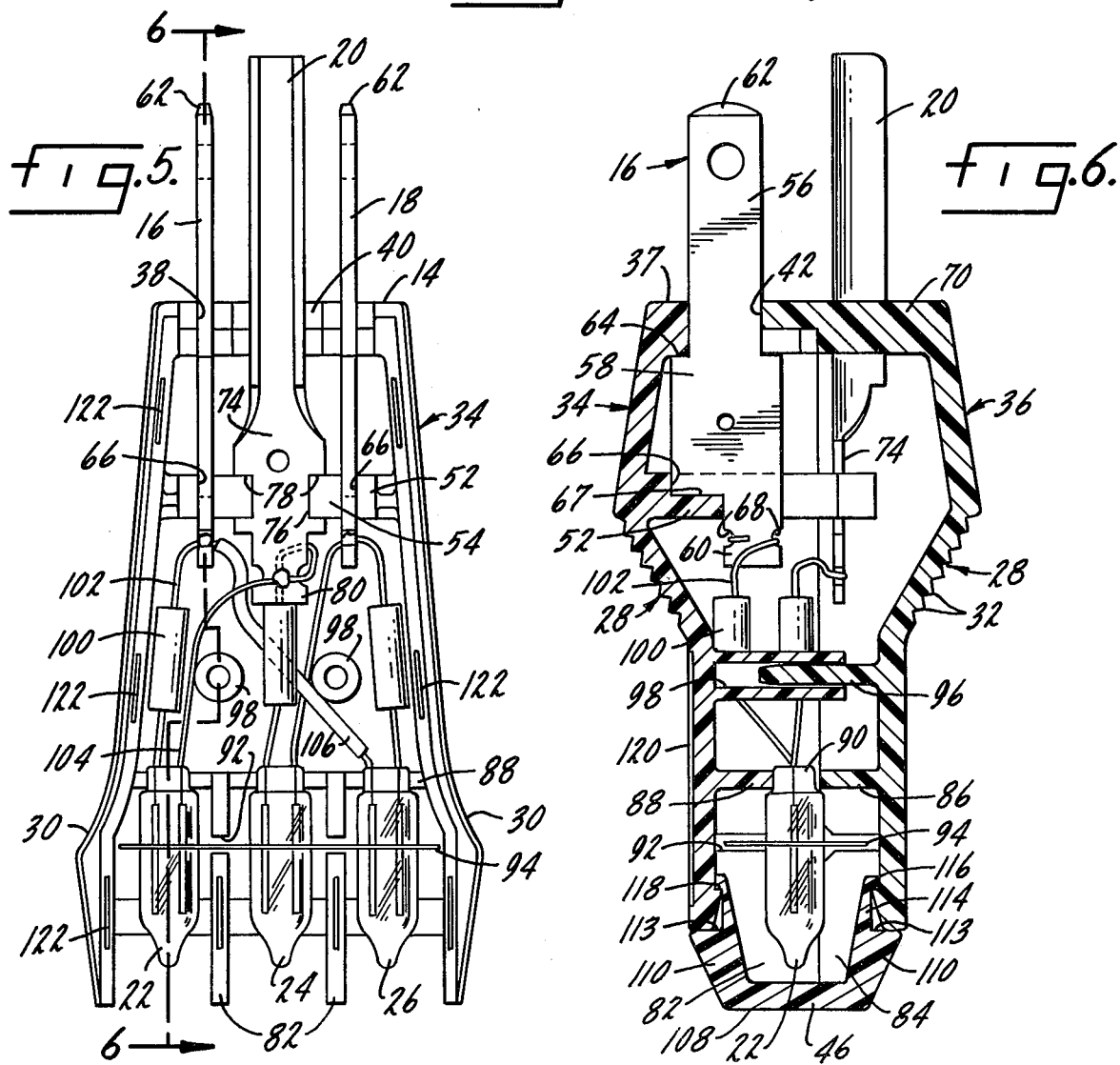

4,034,284

HAND-HELD WALL RECEPTACLE WIRING TESTER WITH OPPOSITELY DISPOSED PUSH/PULL SURFACES FOR INSERTION AND REMOVAL OF THE TESTER

SUMMARY OF THE INVENTION

This invention relates in general to electrical testing equipment and more particularly to a hand-held tester for checking the wiring of a wall receptacle.

A hand-held receptacle wiring tester is provided which includes a housing having first laterally opposite surfaces which spread increasingly apart toward one end of the tester and second laterally opposite surfaces which spread increasingly apart toward the other end of the tester to provide bearing surfaces for respectively pushing the tester into a receptacle and pulling it out. A set of electrical terminal blades protrude from one end of the housing in order to be plugged into a wall receptacle. The housing contains indicator lamps and electrical connecting means between the lamps and respective pairs of the terminal blades so that the lighting of a lamp and various combinations of lamps indicates respective predetermined wiring conditions of the wall receptacle.

Variations of the basic tester include separate enclosed compartments within the housing for each lamp and semi-recessed protective lenses over the lamps. The first and second laterally opposite surfaces may be on the same or different sides of the housing and may be provided with a surface treatment to prevent slippage as the tester is pushed into or out of a wall receptacle. The housing may be longitudinally split so that the tester can be substantially assembled in one half before closing it with the other.

A primary object of the present invention is a hand-held receptacle wiring tester which is provided with non-slip push/pull surfaces to facilitate insertion of the tester into a wall receptacle and its removal therefrom.

A related object is a hand-held receptacle wiring tester having a housing with push/pull surfaces which may be utilized with a single grip of the tester.

Another object is a hand-held receptacle wiring tester in which the terminal blades are held by the housing at two points spaces substantially apart, thereby affording a holding leverage which protects the housing and maintains the blades in their fixed positional relationship.

Another object is a hand-held receptacle wiring tester which is substantially flat so that it may be easily carried in an electrician's pocket or pouch.

Another object is a hand-held receptacle wiring tester in which the legend which indicates the wiring condition of the receptacle is placed on a single, generally flat surface so as to be entirely visible at a glance.

Another object is a hand-held receptacle wiring tester in which the indicator lamps are protected by semirecessed lenses which are thus visible from various angles and yet protected laterally by the walls of the tester housing.

Another object is a hand-held receptacle wiring tester having separate internal compartments for the indicator lamps to prevent diffusion of light from one lamp through the lens of another.

Another object is a hand-held receptacle wiring tester in which the terminal blades, lamps and electrical connector means may be assembled in a casing portion of the housing and be entirely visible for inspection prior to closing and sealing the housing with the cover portion.

Another object is a hand-held receptacle wiring tester which is durable, light-weight and somewhat fitted to the hand of an electrician to facilitate the testing of wall receptacles.

Other objects will become apparent in the ensuing specification, drawings and claims.

BRIEF DESCRIPTION OF THE DRAWINGS

FIG. 1 is a top plan view of a receptacle wiring tester constructed in accordance with the present invention.

FIG. 2 is a side view of the receptacle wiring tester of FIG. 1.

FIGS. 3 and 4 are end views of the receptacle wiring tester shown in FIGS. 1 and 2.

FIG. 5 is an enlarged bottom view of the receptacle wiring tester with the cover portion of the housing removed.

FIG. 6 is a side sectional view taken approximately along line 6—6 of FIG. 5.

DESCRIPTION OF THE PREFERRED EMBODIMENTS

A hand-held electrical tester 10 for checking the wiring of wall receptacles is shown in FIGS. 1–6. The tester includes a housing 12 having a set of electrical terminal blades protruding from one end 14. The terminal blades include two parallel flat blades 16 (hot) and 18 (neutral) and a generally U-shaped ground blade 20. The terminal blades, which are arranged in the conventional fixed positional relationship for insertion into a wall receptacle, are mounted within the housing in a manner described in further detail below. Referring to FIGS. 5 and 6, the housing also contains three indicator lamps 22, 24 and 26, and electrical connecting means between each lamp and a respective pair of the terminal blades so that the lighting of each lamp and each combination of lamps indicates a predetermined wiring condition of a wall receptacle into which the terminal blades may be inserted.

Housing 12 has first laterally opposite surfaces 28 (FIGS. 2 and 6) which spread increasingly apart toward end 14 of the tester and second laterally opposite surfaces 30 (FIGS. 1 and 5) which spread increasingly apart toward the other end of the tester, which surfaces provide bearing surfaces for respectively pushing the tester into a receptacle and pulling it out therefrom. The first and second laterally opposite surfaces are each shown as a pair of surfaces which are generally symmetrically situated with respect to a longitudinally center line through the housing 12 which would intersect end 14. The first laterally opposite surfaces or push surfaces 28 are oppositely disposed on diametrically opposed sides of the tester housing 12. The second laterally opposite surfaces or pull surfaces 30 are similarly disposed but on different sides of the housing from each other and from the push surfaces 28. Although the illustrated form is preferred, the push and pull surfaces 28 and 30 might otherwise be formed as continuous oval or annular surfaces around the housing 12 or discontinuous arcuate surfaces. Likewise, the push and pull surfaces 28 and 30 could each be formed on all four sides of the housing or on all or only some of the sides of any other multi-sided housing. The important point is that the surfaces flare outwardly from the surface of the housing toward one end or the other to form bearing surfaces against which an electrician can push or pull to facilitate using the tester. Again, it is preferred that the push surfaces 28 be longitudinally positioned closer to the end 14 of the tester than the surfaces 30, but this could be otherwise.

In FIGS. 1, 2 and 4, push surfaces 28 are shown with a plurality of spaced ridges 32 formed laterally across each surface. The purpose of these ridges is to prevent slippage of the electrician's grip on the connector as he pushes it into a wall receptacle. The particular design of the ridges is not critical, but rather any non-slip surface treatment could be substituted which would increase the frictional contact between the push surfaces 28 and the electrician's hand. Thus, the surfaces might be knurled, foraminated or otherwise coarsened. The same or different surface treatment may be applied to one or both of the first and second sets of laterally opposite surfaces 28 and 30.

The housing 12 is longitudinally split, as best shown in FIGS. 2 and 3, and thereby consists of a casing portion 34 and cover portion 36. The front wall 37 (FIG. 3) of casing 34 is provided with two parallel slots 38 adapted to receive and properly position the flat blades 16 and 18. A ground support member 40 projects downwardly away from the slots 38 to receive and properly position ground blade 20. The terminal end 14 of cover 36 is provided with cooperating shoulders 42 for retaining flat blades 16 and 18 in their respective slots 38 and a center shoulder 44 for retaining the ground blade 20 within ground support member 40. The other end of the casing and cover portion is generally open for receiving three lenses 46, 48 and 50 which are described in further detail below.

The internal construction and components of receptacle tester 10 are best shown in FIGS. 5 and 6. The terminal blades extend inwardly from the terminal end 14 of the tester and through a blade-retainer wall 52. Like the front wall 37 of casing 34, wall 52 is slotted to receive flat blades 16 and 18 and has a downwardly extending ground blade support member 54. Ground blade retainer wall 52 serves not only to retain the blades in their proper positional relationship, but also as a member through which longitudinal forces are applied to the terminal blades to push them into a wall receptacle.

The shape and assembled position of the flat terminal blade 16 is shown best in FIG. 6. The other flat terminal blade 18 may be constructed and mounted similarly. Basically, the blade has three integral sections: a terminal plug portion 56, a center section 58 and an inner wrap-around connector section 60. The terminal plug portion 56 is adapted to extend longitudinally outwardly from casing 34 through one of the slots 38 for the purpose of being plugged into a wall receptacle. Thus the dimensions of plug portion 56 are conventional. The outer tip 62 may be rounded and tapered to further ease insertion into the typically stiff wall receptacles found in new construction. The center section 58 is enlarged vertically above and below the terminal plug section 56. Thus a shoulder 64 is provided which is adapted to abut against the front wall 37 of casing 34 to prevent the terminal blade from being pulled longitudinally out of the housing. The inner end of center section 58 is received within a slot 66 in retainer wall 52, which slot provides longitudinal restraint to prevent the terminal blade from being pushed into the housing. The slots 38 and 66 in casing 34 both provide the lateral restraint necessary to maintain the proper and uniform spacing between flat blades 16 and 18. Slot 66 is shown as being stepped at 67 to allow the middle section 58 of the terminal blade to be seated partially within retainer wall 52 while allowing the connector portion 60 to extend completely through the wall and further into the housing. Connector section 60 has two vertically semi-circular indentations 68 adapted to receive wires for making an electrical connection with the terminal blade. The flat blades 16 and 18 are vertically restrained in the assembled housing in a number of ways. First, the cover portion 36 has a front wall 70 with shoulders 42 which are adapted to close slots 38 of the casing and restrain the terminal blades therein. The center section 58 of the terminal blade is fitted between slot 66 in retainer wall 52 and the front wall 37 so that vertical rotation is restricted. But to further restrict vertical movement of the blade at the retainer wall 52, it is preferred that the blade be staked into slot 66 by closing the retainer wall over the slot such as by heat staking or ultrasonic staking.

The shape and installed position of ground blade 20 can likewise be seen in FIGS. 5 and 6. Extending longitudinally outwardly from ground support member 40 on the front wall 37 of the casing, the ground blade is generally U-shaped in the conventional manner for insertion into the ground slot of a wall receptacle. Inwardly of front wall 37, the ground blade becomes flattened prior to reaching retainer wall 52. The flattened middle portion 74 of ground blade 20 is wider (FIG. 5) than the center slot 76 in retainer wall 52. Therefore, two laterally opposite indentations 78 are formed in the ground blade so that it may be fitted into slot 76. Ground blade 20 also has a wrap-around connector section 80 at its inner end. Longitudinal restraint for the ground blade in its assembled position is provided by the edges of the indentations 78 which abut against both sides of retainer wall 52. Lateral restraint for the ground blade is provided by the sides of the ground support member 40 at the front wall 37 and by the sides of slot 76 in retainer wall 52. Vertical restraint is provided by shoulder 44 of cover 36 at the front wall and by staking the ground blade in position at the retainer wall by at least partially closing slot 76 over the ground blade.

Looking at the other end of the housing in FIGS. 5 and 6, both the casing 34 and cover 36 are provided with cooperating longitudinal dividing walls 82 and 84 respectively, which walls are generally equally spaced from the sides of the tester and from each other to form three separate compartments for lamps 22, 24 and 26. In their assembled positions as shown in FIG. 6, walls 82 and 84 abut against one another to prevent the diffusion of light from one lamp into the compartment of another.

To further enclose the lamp compartments, a wall 86 laterally spans the cover 36 in engagement with the inner ends of walls 84. Likewise, housing 34 is provided with a similarly disposed lateral wall 88 which, however, is shorter than the longitudinal walls 82 to provide a gap between walls 86 and 88 through which the terminal portion 90 (FIG. 6) of the lamps may extend. The divider walls 82 and 84 also have laterally spaced slots 92 intermediate their length, which slots are adapted to receive and retain a lamp retainer 94. The lamp retainer 94 is a thin, flat member of cardboard, plastic or any other suitable material having three laterally spaced holes which are adapted to receive the lamps 22, 24 and 26 to support them in a generally centralized position within the compartments.

Between the terminal blade retainer wall 52 and lamp compartments, the casing 34 and cover 36 are generally open to accommodate the electrical connecting means between the lamps and terminal blades. The only interference within this area is the peg and sleeve connections between the cover 36 and casing portion 34 of the housing. The cover is provided with a pair of spaced apart vertically directed pegs 96 which are adapted to be received within cooperating sleeves 98 of casing 34 to fix the lateral and longitudinal positional relationship between the cover and casing in the assembled receptacle tester. The peg and sleeve connections are further advantageous for separating the various electrical connecting means between the lamps and terminal blades.

The aforementioned electrical connecting means includes the wires, resistors and insulative tubing necessary to complete the electrical connections between each lamp and a respective pair of the terminal blades. Preferably, resistor attached glow lamps which may be utilized have a resistor 100 pre-connected along one of the lead wire 102 of each lamp. Thus, the only assembly required is insulating certain crossover wires and electrically connecting each lead wire to a terminal blade. In the preferred embodiment, a .25 watt lamp is used having an attached 22K Ohm register. Referring to FIG. 5, the resistor attached lead 102 and plain lead 104 of lamp 22 are connected respectively to the hot blade 16 and ground blade 20. Likewise, the leads of lamp 24 are connected respectively to ground blade 20 and neutral blade 18. Finally, the leads of lamp 26 are connected respectively to neutral blade 18 and hot blade 16 to complete a parallel circuit between the lamps and blades. In the crossover area of the casing between sleeves 98 an insulative tubing 106 may be used to cover the plain lead of lamp 26 to insulate it from and separate the leads of the center lamp 24.

The actual connection to each terminal blade is accomplished by wrapping an end of a wire about the wrap-around connector portion of the blade as at 60 in FIG. 6 with respect to the hot blade 16. The wire is held in the semi-circular indentation 68 to prevent it from slipping longitudinally off the blade. It is preferred that the wires also be soldered to their respective blades to insure a strong mechanical and electrical connection to the blades.

To complete the receptacle tester assembly, a set of generally three-sided lenses 46, 48 and 50, are fitted onto the open ends of the lamp compartments to close the same and protect the lamps therein. A cross-section of lens 46 is shown in FIG. 6.

Each lens has a generally flat outer surface 108 with side walls 110 which taper vertically into the housing 12 at an angle conforming to the tapered ends 112 of the housing sidewalls shown in FIG. 2. The side walls 110 are formed with a shoulder 113 which is adapted to abut against the end of the casing 34 or cover 36. Extending into the housing from shoulders 113 are legs 114 having vertically directed feet 116 which are adapted to engage lips 118 formed in the casing 34 and cover 36 to rigidly secure the lenses over the lamp compartments. In FIGS. 1 and 2, it can be seen that the open sides of lenses 46 and 50 are protected by the sidewalls of housing 12 and that the lenses protrude longitudinally beyond the housing by a distance approximating the thickness of the lens. The other sides of the lenses are protected by divider walls 82 and 84. It is preferred that the lenses be constructed of translucent plastic and each of a different color to aid in identifying the particular lamp or combination of lamps which light up when the tester is plugged into a wall receptacle. Thus lenses 46, 48 and 50 may be clear, red and amber respectively. Accordingly, it is the lighting of the clear and amber lamps which indicates that the wiring of a receptacle is corret. The other combinations are as follows:

| Color | Wiring Condition |
| --- | --- |
| Amber only | Open |
| Amber and red | Reversed polarity |
| None | Open hot |
| Clear only | Open neutral |
| Red and clear | Hot and ground reversed |
| Red only | Hot on neutral with hot open |

To identify which wiring condition is designated by which combination of lamps, an appropriate label may be attached to a flat surface 120 on the housing adjacent the lenses between the pull surfaces 30. Surface 120 may be slightly recessed into the housing as shown in FIG. 6 to protect the edges of the label. A laminated label with a pressure-sensitive adhesive backing may then be applied to surface 120, which label would generally fill the recess of surface 120 and be flush with the housing surface.

To assemble receptacle tester 10, casing 34 is laid open-side-up as seen in FIG. 5. Insulative tubing 106 is slid onto the plain lead of lamp 26 after which the leads of all lamps are electrically connected to their respective terminal blades. Flat blades 16 and 18 are then pressed into position within slots 38 of front wall 37 and slots 66 of terminal blade retainer wall 52. Ground blade 20 may then be inserted so that its generally U-shaped outer portion is supported within the ground blade support 40 (FIG. 3) and so that the indentations 78 of the inner flat portion of the blade are fitted over the ground blade support portions 54 of retainer wall 52. Lamp retainer 94 may then be inserted over lamps 22, 24 and 26, to properly space them for insertion into the lamp compartments of the casing 34. Lamp retainer 94 is pressed into slots 92 in the divider walls 82 of the casing 34. The resistors 100 and lead wires 102 and 104 for each of the lamps may then be pressed into the casing about sleeves 98. The lead wires are sufficiently bent to allow each lamp to be longitudinally positioned so that its terminal portion 90 overlies the inner lateral wall 88 which partially closes each lamp compartment in casing 34.

To rigidly secure the terminal blades in their fixed positional relationship, it is preferred that the blades be staked securely at retainer wall 52. This may be accomplished by heat staking, ultrasonic staking or any other mechanical means for closing slots 66 over flat blades 16 and 18 (FIG. 5) and at least partially closing slot 76 over ground blade 20.

With the blades, lamps and electrical connecting means thus assembled in the casing portion 34 of housing 12, the lenses 46, 48 and 50 and cover 36 may then be added to complete the receptacle tester assembly. The lenses are inserted between the casing 34 and cover 36 so that the lips 118 of both portions of the housing will engage the small inner feet 116 of the lens as the housing is closed to thereby securely retain the lenses at the end of the housing. To properly align cover 36 over casing 34, both laterally and longitudinally, it is simply necessary to insert pegs 96 properly into sleeves 98. The housing portions are then pressed together to close and seal the housing. It is preferred that the housing portions be permanently sealed together to rigidify the tester unit so that it may best withstand the abuse it is likely to incur in use in the field. It is preferred that the housing sections 34 and 36 be ultrasonically joined together, although a heat seal, adhesive or other suitable means may be otherwise used. To ultrasonically join the housing sections, six so-called energy directors 122 (FIG. 5) are formed along the edges of casing 34 which will contact the cover 35. Two of the energy directors 122 are formed on the divider walls 82 between the lamp compartments. The energy directors 122 are simply thin raised integral portions of the casing material which preferably rise to a point. As the housing portions are joined, the material of the energy directors 122 is fused to that of the cover 36 to form a unitary enclosed housing.

The use, operation and function of the invention are as follows:

The present invention is useful for quickly and easily checking the polarity or wiring condition of a conventional three-prong electrical wall receptacle. To do this, the terminal blades of the receptacle tester are inserted into the wall receptacle in the same manner as the plug of any electrical appliance. As a result, a lamp or combination of lamps which corresponds to the wiring condition of the receptacle will light up to indicate this information to the electrician or inspector using the device. If no lamp lights up, either the hot terminal of the receptacle is open or no power is being supplied to the receptacle.

Checking receptacles with the tester device of the present invention has several significant advantages. First, checking may be accomplished quickly since the receptacle plate need not be removed nor the receptacle itself pulled away from the wall for visual inspection. As a result, all of the receptacles of a particular construction job may be tested in the time it may previously have taken to spot-check only a portion of them.

One of the difficulties of checking the wiring of wall receptacles in new construction, even with a hand held receptacle tester, is that the new receptacles commonly are very stiff and resist the insertion of a plug or tester device such as the present invention. To overcome this difficulty, the present invention is provided with laterally opposed push-pull surfaces to strengthen the grip of the electrician on the tester and thereby facilitate its insertion into a receptacle. The push surfaces 28 are somewhat steep and provided with a surface treatment such as the ridges 32 to prevent slippage of the electrician's hand while inserting the tester. Since the force required to remove the tester from a receptacle is generally less than that needed for insertion, the pull surfaces 30 may be gently sloped outwardly from the surface of the housing so as to comfortably conform to the grip of the electrician using the device. Primarily for this purpose of somewhat fitting the tester to an electrician's hand, it is preferred to have the push surfaces 28 located closer to the terminal end 14 of the housing and on different sides of the housing from the pull surfaces 30. With such a construction, the push and pull surfaces are both effective to assist an electrician using a single grip on the tester to both insert and remove the tester from a wall receptacle in one motion, which is all that is necessary to precisely check the wiring of the receptacle.

It is also preferred that the push and pull surfaces be formed on different sides of the housing so that neither interferes with the use of the other. Whereas it is desirable to minimize the size of the housing and yet accommodate the different sizes of hands and styles of grips of many individuals, segregating the bearing surfaces on different sides of the housing accommodates every user. Futhermore, since that portion of the housing behind each bearing surface is narrower than the bearing surface itself, the operator's hand comes maturally to rest against the appropriate bearing surface when using the tester device. In FIG. 1, it can be seen that the terminal end 14 of the housing is somewhat narrow and widens smoothly and gradually toward the other end to a point where the slope is increased to form each bearing surface 30. Similarly, turning the device 90° as seen in FIG. 2, the lamp end of the housing is flared as at 112 and maintains a somewhat narrow flat thickness toward the terminal end of the housing to the point where the push surfaces spread increasingly apart to provide bearing surfaces for inserting the tester device.

The housing 12 is constructed with several features to increase its useful life as well as facilitate the use of the device. By securely holding the terminal blades both at the front wall of the housing and at the terminal blade retainer wall 52, a definate holding leverage is provided which increases the force necessary to divert the terminals out of their fixed positional relationship.

Each terminal blade may be viewed as a lever mounted between front walls 37 and 70 which serve as a fulcrum. Thus, the further apart the front wall 37 and terminal blade retaining wall 52 are, the less the force is that will be applied to the housing in response to forces acting externally of the housing on the terminal blades. This is because of the greater leverage within the housing. As a result, deformation of the plastic housing is less likely because of the lower forces and the useful life of the tester device is increased.

The lamp lenses 46, 48 and 50 are constructed to both improve the visibility of the lamps of the test device and protect them from mechanical impact. Since the lenses are semi-recessed longitudinally outwardly from housing 12, they can be seen from all four sides and the visible end of the tester when it is inserted into a wall receptacle. Thus, regardless of the orientation of the receptacle on the wall, the electrician can simply look down from a comfortable position above the tester to see which lamps are lit. But the lenses are not recessed so far as to form an external bulb which itself is subject to fracturing. Rather, the lenses protrude longitudinally beyond the housing by a distance approximating the thickness of the lens so that only solid bodies of the lens material are exposed. Otherwise, the entire sides of all three lenses are completely shielded and protected by the flared ends 112 and divider walls 82 and 84 of the housing.

Assembly of the tester device of the present invention is greatly facilitated by providing a longitudinally split housing comprised of a separate casing 34 and cover 36. First, the casing is completely open so that each of the lamps, blades and electrical connecting means can be directly placed into their fixed positions within the casing as opposed to fishing them in from one end or the other. Secondly, because the casing is completely open before closing it with cover 36, all of the assembled elements can be visually inspected prior to closing and sealing the housing.

Finally, the wiring condition of a given receptacle can be immediately apparent, even to one unfamiliar with the receptacle tester since a label identifying the respective wiring conditions may be prominently displayed on the single large flat surface 120 formed into housing 12. The entire label is visible at a glance and the tester body need not be rotated or turned to read any portion of the label.

Whereas the preferred form of the invention has been described herein, it should be realized that there may be many modifications, substitutions and alterations thereto.

I claim:

1. In a hand-held receptacle wiring tester, a housing, two generally parallel flat blades and a ground blade mounted within the housing and protruding from the wall at one end thereof in fixed positional relationship for insertion into a wall receptacle, said flat blades each having a first shoulder adapted to abut against said wall of the housing from within to prevent the blade from being pulled out of the housing, and a second shoulder spaced longitudinally from the first shoulder and adapted to abut against an internal retaining wall of the housing to prevent the blade from being pushed into the housing, a plurality of indicator lamps at the other end of the housing and contained within the housing, electrical connections between the lamps and the blades so that the lighting of the lamp and various combinations of lamps indicates respective predetermined wiring conditions of a wall receptacle into which the terminal blades are inserted, the housing having first laterally opposed surfaces on the exterior thereof which spread increasingly apart toward the said one end of the tester and second laterally opposed surfaces which spread increasingly apart toward the other end of the tester, thereby to provide bearing surfaces for respectively pushing the tester manually into a receptacle and pulling it out therefrom, each of the first and second surfaces comprising a pair of surfaces which are generally symmetrically situated with respect to a longitudinal center line through the housing, the first and second pairs of surfaces being on different sides of the housing and limited thereto, the first laterally opposed surfaces being longitudinally positioned closer to said one end of the tester than the second laterally opposed surfaces with the first and second laterally opposed surfaces being an axial nonoverlapping relationship to each other.

2. A hand-held receptacle wiring tester according to claim 1 wherein at least one pair of said laterally opposite surfaces are provided with a non-slip surface treatment to prevent slippage during insertion or removal of the tester.

3. A hand-held receptacle tester according to claim 1 wherein the housing is longitudinally split and thereby comprises a casing portion and cover portion, said casing portion inculding means for supporting the terminal blades, lamps and electrical connecting means independent of assembly with the cover portion.

4. A hand-held receptacle wiring tester according to claim 3 wherein each of the terminal blades engages the housing at two points spaced substantially apart longitudinally along the blades thereby providing a holding leverage which increases the force necessary to divert the terminals out of their fixed positional relationship.

5. A hand-held receptacle wiring tester according to claim 3 further comprising a translucent lens overlying each of said lamps and separate substantially enclosed internal compartments within the housing for each lamp to prevent diffusion of light from one lamp through the lens of another.

6. A hand-held receptacle wiring tester according to claim 5 wherein each lamp lens is semi-recessed outwardly from the housing by a distance approximating the thickness of the lens and wherein the housing walls laterally protect the lens.

* * * * *